United States Patent
Hauer

(10) Patent No.: US 6,815,117 B2
(45) Date of Patent: Nov. 9, 2004

(54) METHOD FOR DETERMINING A CURRENT DENSITY DISTRIBUTION IN A FUEL CELL STACK

(75) Inventor: Karl-Heinz Hauer, Wolfsburg (DE)

(73) Assignee: Volkswagen AG, Wolfsburg (DE)

( * ) Notice: Subject to any disclaimer, the term of this patent is extended or adjusted under 35 U.S.C. 154(b) by 266 days.

(21) Appl. No.: 10/208,413

(22) Filed: Jul. 29, 2002

(65) Prior Publication Data

US 2003/0020454 A1 Jan. 30, 2003

Related U.S. Application Data

(63) Continuation of application No. PCT/EP01/00539, filed on Jan. 18, 2001.

(30) Foreign Application Priority Data

Jan. 28, 2000 (DE) .......................................... 100 03 584

(51) Int. Cl.[7] ........................ H01M 10/42; G01N 27/72
(52) U.S. Cl. ........................... 429/90; 324/226; 324/227
(58) Field of Search ......................... 429/12, 13, 90–93; 324/378, 389, 402, 200, 226, 227, 232, 117 H

(56) References Cited

U.S. PATENT DOCUMENTS

| 4,939,459 A | 7/1990 | Akachi et al. |
| 6,036,838 A | 3/2000 | Wieser et al. |

FOREIGN PATENT DOCUMENTS

| DE | 36 31 476 A1 | 10/1987 |
| DE | 40 21 358 A1 | 1/1992 |
| DE | 42 38 356 A1 | 5/1994 |
| DE | 43 07 453 A1 | 9/1994 |
| DE | 44 39 691 A1 | 5/1996 |
| DE | 44 40 089 A1 | 5/1996 |
| DE | 195 26 983 C2 | 1/1997 |
| DE | 197 50 738 C1 | 1/1999 |
| DE | 198 13 890 A1 | 9/1999 |
| WO | WO 99/26305 | 5/1999 |

OTHER PUBLICATIONS

Sometani, T. et al.: "Eddy Current Measurment on a Non–circular Model Shell", Japanese journal of Applied Physics, vol. 28, No. 1, Jan., 1989, pp. 112–115.

Stumper, J. et al.: "In–Situ Methods for the Determination of Current Distribution in PEM Fuel Cells", Elsevier Science Ltd., vol. 43, No. 24, 1998 pp. 3773–3783.

Wieser, Ch. Et al.: "A New Technique for Two–Dimensional Current Distribution Measurements in Electrochemical Cells", Kluwer Academic Publishers, 2000, pp. 803–807.

S.J.C. Cleghorn et al.: "A printed circuit board approach to measuring current distribution in a fuel cell", *Journal of Electrochemistry, Jul. 1998, pp. 663–672.*

*Primary Examiner*—Evan Pert

(57) ABSTRACT

A method for detecting a current density distribution in a fuel cell stack by detecting the magnetic field, which surrounds the fuel cell stack and which is caused by a current flow in the fuel cell stack, is provided. Sensors for an x-component, a y-component and a z-component of the magnetic flux density detect the magnetic flux density at several points outside the fuel cell stack. The position of the sensors for the magnetic flux density is detected in relation to the fuel cell stack. The thus detected values for the magnetic flux density and the allocated position are converted into current density values according to the position in the fuel cell stack by using a Maxwell equation which defines the magnetic field strength and the material equation which relates the magnetic field strength to the magnetic flux density.

28 Claims, 3 Drawing Sheets

METHOD FOR DETERMINING A CURRENT DENSITY DISTRIBUTION IN A FUEL CELL STACK

CROSS-REFERENCE TO RELATED APPLICATION

This application is a continuation of copending International Application No. PCT/EP01/00539, filed Jan. 18, 2001, which designated the United States and was not published in English.

BACKGROUND OF THE INVENTION

FIELD OF THE INVENTION

When operating fuel cell stacks in fuel cell systems, in particular in fuel cell systems in motor vehicles, it is necessary to be able to determine the current density distribution in the fuel cell stacks. Various methods of measuring a current density distribution in fuel cell stacks are known. Appropriate methods for this purpose are described in the publication "In-situ methods for the determination of current distributions in PEM-fuel cells," by Jürgen Stumper, Ballard Power Systems Inc., 9000 Glenlyon Parkway, Burnaby, BC, Canada V5J 5J9, Electrochimica Acta, Vol. 43, 1998 and in the publication "A printed circuit board approach to measuring current distribution in a fuel cell," by S. J. C. Cleghorn, C. R. Derouin, M. S. Wilson, S. Gottesfeld, Los Alamos, Journal of Electrochemistry, July 1998.

These conventional methods for measuring the current density distribution in fuel cell stacks have the following disadvantages. First of all, each of these measurement methods requires an intervention (manipulation) in the fuel cell stack. Measurement reactions or feedbacks and corruptions of the measurement results resulting from this manipulation of the fuel cell stack thus cannot be excluded. Furthermore, it is necessary to define, prior to performing the measurement and the manipulation of the fuel cell stack, the point in the cell at which the corresponding current density distribution is to be measured. With this conventional method, the wiring complexity for the measurement increases with an increasing resolution, thus limiting its acceptable scope. Due to the complexity of the conventional measurement methods and the manipulation that is required for this purpose on the fuel cell stack, the conventional measurement methods are suitable only for research and development of fuel cell stacks, but cannot be used for a continuous measurement during operation or in service intervals. A further disadvantage of the conventional measurement methods is that the variation of the current density distribution along the fuel cell stack, that is to say the variation from cell to cell, cannot be measured when using these methods.

SUMMARY OF THE INVENTION

It is accordingly an object of the invention to provide a method for determining the current density distribution in fuel cell stacks, which overcomes the above-mentioned disadvantages of the heretofore-known methods of this general type and through the use of which the current density distribution in fuel cell stacks can be determined, across the fuel cell cross section, at any desired point in the fuel cell stack.

With the foregoing and other objects in view there is provided, in accordance with the invention, a method for determining a current density distribution in a fuel cell stack, the method includes the steps of:

providing a current flow through the fuel cell stack such that the current flow generates a magnetic field surrounding the fuel cell stack; and determining the current density distribution in the fuel cell stack from the magnetic field surrounding the fuel cell stack.

According to a preferred mode of the method according to the invention, the magnetic field which surrounds a fuel cell stack through which a current is flowing is advantageously measured at a number of points, and the current density distribution across the fuel cell cross section in the interior of the stack is then deduced on the basis of this measurement.

The method according to the invention for determining the current density distribution in fuel cell stacks by measuring the magnetic field which surrounds the stack in this case has the advantage that no change (manipulation) in the fuel cell stack itself is required. Furthermore, measurement reactions from the measurement technique on the current density distribution can be virtually completely avoided. In addition, the current density distribution can be measured in any desired cell in the stack, without needing to define one cell in advance. Furthermore, it is possible to measure the variation of the current density distribution along the stack (from cell to cell). Thus, in comparison to the conventional methods, the measurement method according to the invention allows a greater measurement accuracy due to the greater resolution, while at the same time considerably reducing the costs for each measurement process.

A preferred mode of the method according to the invention includes the steps of positioning at least one sensor at given positions outside the fuel cell stack for detecting an x-component of a magnetic flux density, a y-component of a magnetic flux density, and a z-component of a magnetic flux density, with x, y, and z indicating axes in a Cartesian coordinate system; determining the given positions of the at least one sensor with respect to the fuel cell stack; calculating current density values as a function of respective positions in the fuel cell stack from values of the magnetic flux density and the given positions associated therewith; and performing the calculating step by using a Maxwell's equation defining a magnetic field strength, and by using a material equation defining a relationship between the magnetic field strength and the magnetic flux density.

Another mode of the method according to the invention includes the step of sequentially recording measurement points by moving a single flux density sensor to the measurement points in order to sequentially measure a magnetic flux density at the measurement points and by moving a further sensor to the measurement points in order to determine a position of the single flux density sensor.

Yet another mode of the method according to the invention includes the step of recording measurement points in parallel by using a plurality of sensors for measuring a magnetic flux density and for determining respective positions such that all measurement values are recorded simultaneously.

A further mode of the method according to the invention includes the step of recording measurement points with a plurality of sensors in parallel and additionally recording measurement points sequentially by recording a set of measurement values in parallel and by subsequently repositioning the plurality of sensors and recording a further set of measurement values.

Another mode of the method according to the invention includes the step of identifying a reference point and using an algorithm for counting steps in a positioning device operating with fixed increments for positioning the at least one sensor.

Yet another mode of the method according to the invention includes the step of indicating a position of the at least one sensor relative to the reference point.

A further mode of the method according to the invention includes the steps of positioning a plurality of sensors spatially fixed with respect to one another; and performing a parallel measurement with the plurality of sensors.

Yet a further mode of the method according to the invention includes the steps of providing the plurality of sensors on a common mount such that the plurality of sensors are spatially fixed with respect to one another; and moving the plurality of sensors jointly along an x-direction defining a main direction of the fuel cell stack.

Another mode of the method according to the invention includes the step of varying a distance between the at least one sensor for detecting a magnetic flux density and the fuel cell stack in order to match a measurement range of the at least one sensor to a magnetic flux density outside the fuel cell stack.

Yet another mode of the method according to the invention includes the step of positioning a plurality of sensors for detecting a magnetic flux density in a given plane.

Another mode of the method according to the invention includes the step of positioning a plurality of sensors for detecting a magnetic flux density in a given plane such that an x-axis defines a main axis of the fuel cell stack and such that the x-axis is orthogonal with respect to the given plane and such that the given plane and the x-axis define an intersection point.

A further mode of the method according to the invention includes the step of evaluating the x-component of the magnetic flux density in order to identify points at which the current density distribution in the fuel cell stack changes, wherein the x-component of the magnetic flux density is directed along a main direction of the fuel cell stack.

Another mode of the method according to the invention includes the step of using sensors each configured to measure three magnetic flux density components including the x-component of a magnetic flux density, the y-component of a magnetic flux density, and the z-component of a magnetic flux density.

Yet another mode of the method according to the invention includes the step of using sensors each configured to measure only one magnetic flux density component selected from the group consisting of the x-component of a magnetic flux density, the y-component of a magnetic flux density, and the z-component of a magnetic flux density.

Another mode of the method according to the invention includes the steps of using at least a first sensor for detecting the x-component of a magnetic flux density; and using at least a second sensor for detecting the y-component and the z-component of a magnetic flux density.

A further mode of the method according to the invention includes the step of acquiring more measurement values than necessary for a desired resolution of the current density distribution in the fuel cell stack.

Another mode of the method according to the invention includes the steps of providing an equation system for the current density distribution in the fuel cell stack; and using an iterative calculation method for calculating the equation system for the current density distribution.

Yet another mode of the method according to the invention includes the step of deducing the current density distribution in the fuel cell stack by comparing measurement values of the magnetic field surrounding the fuel cell stack with magnetic fields of fuel cell stacks having known current density distributions.

A further mode of the method according to the invention includes the steps of providing an equation system for the current density distribution in the fuel cell stack; using an iterative calculation method for calculating the equation system for the current density distribution; and additionally deducing the current density distribution in the fuel cell stack by comparing measurement values of the magnetic field surrounding the fuel cell stack with magnetic fields of fuel cell stacks having known current density distributions.

Another mode of the method according to the invention includes providing an equation system for the current density distribution in the fuel cell stack; using a Monte Carlo algorithm for calculating current density values in order to solve the equation system by performing the steps of using an assumed current density distribution for providing a calculated magnetic field resulting from the assumed current density distribution; comparing the calculated magnetic field with a measured magnetic field; correcting the assumed current density distribution in a subsequent iteration loop, such that a difference between the calculated magnetic field and the measured magnetic field is reduced; and terminating the Monte Carlo algorithm when a correlation between the calculated magnetic field and the measured magnetic field reaches a given correlation strength, and using the assumed current density distribution as a result.

A further mode of the method according to the invention includes the step of increasing a resolution of the current density distribution calculated from measurement results by increasing a number of measurement values for the magnetic flux density and the given positions of the at least one sensor.

Another mode of the method according to the invention includes the steps of measuring an earth's magnetic field prior to detecting a magnetic flux density outside the fuel cell stack; and subtracting the earth's magnetic field from the magnetic flux density detected outside the fuel cell stack.

Yet another mode of the method according to the invention includes the steps of modulating the current flow through the fuel cell stack with a given low frequency; and suppressing an influence of a quasi-static earth's magnetic field on a measurement result by using a hardware filter and/or a software filter for flux density measurements.

A further mode of the method according to the invention includes the steps of supplying all measurement values of the magnetic field surrounding the fuel cell stack to an electronic measurement processing system; automatically calculating and storing the current density distribution in the fuel cell stack; and comparing the current density distribution with previous measurement results.

Yet a further mode of the method according to the invention includes the steps of supplying all measurement values of the magnetic field surrounding the fuel cell stack, of the given positions of the at least one sensor and of the current flow through the fuel cell stack to an electronic measurement processing system; automatically calculating and storing the current density distribution in the fuel cell stack; and comparing the current density distribution with previous measurement results.

Another mode of the method according to the invention includes the step of measuring a magnetic field strength of the magnetic field generated by the current flow through the fuel cell stack.

A further mode of the method according to the invention includes the steps of performing a first measurement by scanning the fuel cell stack entirely with a coarse resolution;

and performing a second measurement by scanning critical areas of the fuel cell stack with a fine resolution.

Other features which are considered as characteristic for the invention are set forth in the appended claims.

Although the invention is illustrated and described herein as embodied in a method for determining the current density distribution in a fuel cell stack, it is nevertheless not intended to be limited to the details shown, since various modifications and structural changes may be made therein without departing from the spirit of the invention and within the scope and range of equivalents of the claims. The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
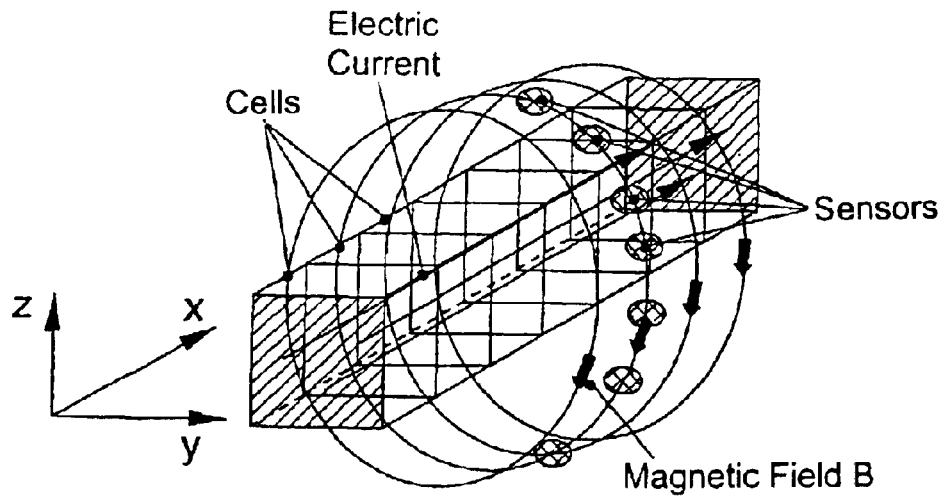
FIG. 1 is a schematic illustration of a current flow, of the magnetic field and of the sensor configuration in accordance with the invention in an optimally operating fuel cell stack wherein boundary effects have been ignored.

Referring now to the figures of the drawings in detail and first, particularly, to FIG. 1 thereof, there is shown a fuel cell stack which includes a number of individual cells with current flow lines in the interior of the stack, and a magnetic field B outside the stack as a result of the current flow in the fuel cell stack. In order to determine the current density distribution in the stack, the external magnetic field of the fuel cell stack to be investigated is measured in a plane at the point x=x0 in the y and z directions (By and Bz), and the current density distribution J(x0, y, z) in the interior of the stack is deduced. The calculation for determining the current density is based on Maxwell's equation $$\oint_{\text{Boundary of } A} \vec{H} \cdot d\vec{s} = \iint_{(A)} \vec{J} \cdot d\vec{A} \quad (1)$$

and the material equation $$\vec{B} = \mu \cdot \vec{H} \quad (2)$$

where B is the magnetic flux density, H is the magnetic field strength, J(x0, y, z) is the current density distribution in the interior of the stack at the point x=x0, and A is the integration area.

In order to determine the current density distribution at the point x=x0, the stack is sectioned at the point x=x0 (conceptual model), and the section area is subdivided into area increments through which current flows. The equations (1) and (2) are applied to each area increment. The total flux density in space can be calculated by superimposing the resultant individual fields. This total flux density is equated to the measured flux density in the plane x=x0, such that a linear equation system is produced for the currents, and hence for the current densities, of each area increment (see equation 3). The right-hand side of the equation system in this case represents the magnetic flux density B, which is measured in the section plane and which can be assumed to be known, since it is determined by measurement. The matrix A in this case takes account of the distance between the area increment and the measurement point.

$$A(x0,y,z,y',z') \cdot \vec{J}(x0,y,z) = \vec{B}(x0,x',z') \quad (3)$$

where:
x0=section plane or measurement plane
y'=y-coordinate of the respective measurement point
z'=z-coordinate of the respective measurement point
y=y-coordinate of the respective area element
z=z-coordinate of the respective area element
$\vec{B}$=vector of the measured flux densities
$\vec{J}$=vector of the unknown current densities in the area elements The vector of the current densities and hence the current density in each area element and thus the current density distribution can be determined by solving equation (3). The solution is indicated by equation (4):

$$\vec{J}(x0,y,z) = A^{-1}(x0,y,z,y',z') \cdot \vec{B}(x0,x',z') \quad (4)$$

Figure 2:
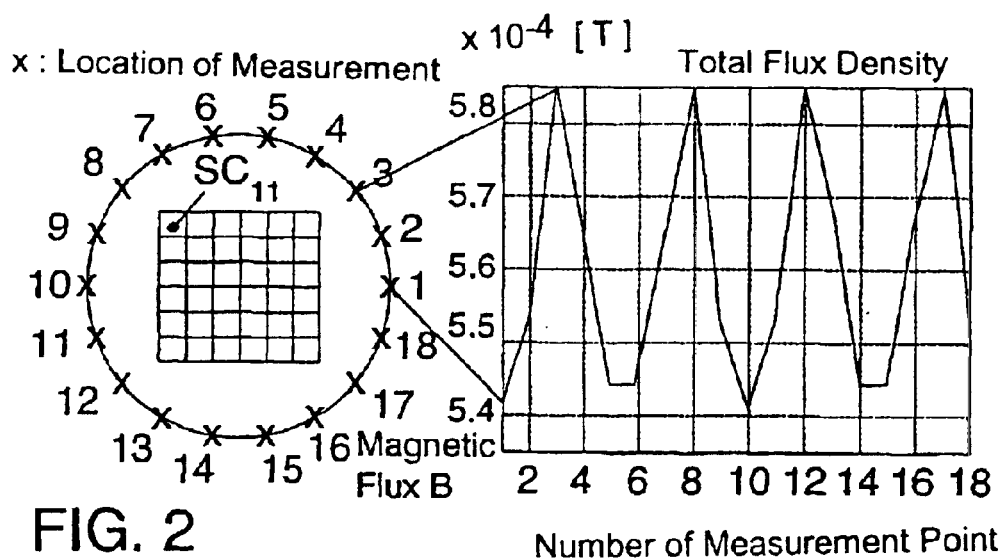
FIG. 2 is a schematic view of an end face of a fuel cell stack with a circular arc around the longitudinal axis (x) of the fuel cell stack together with a graph for illustrating the magnetic flux density B measured at discrete points on the circular arc, wherein the current density distribution is in this case assumed to be homogeneous over the cell cross section.
Figure 3:
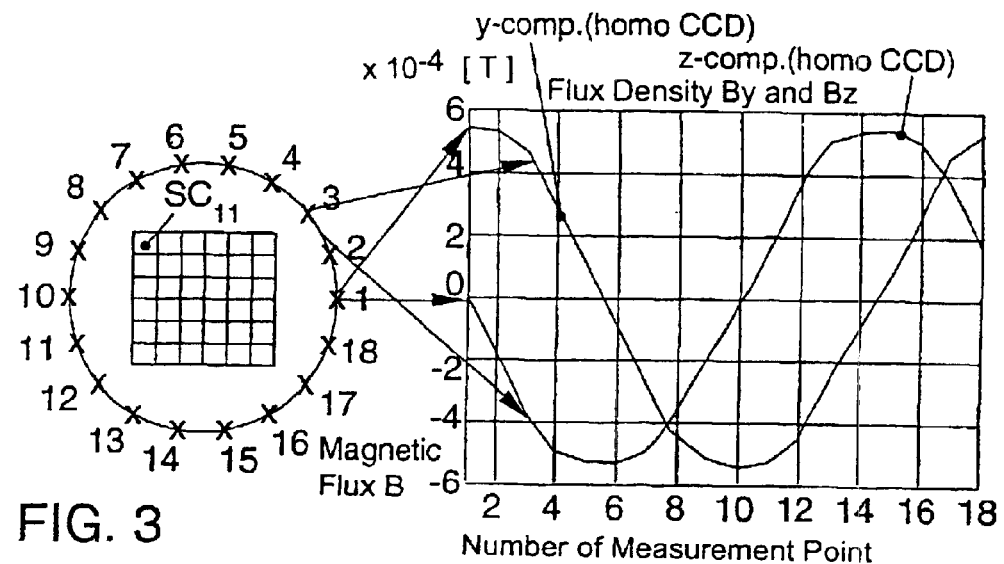
FIG. 3 is a schematic view of an end face of a fuel cell stack with a circular arc around the longitudinal axis (x) of the fuel cell stack together with a graph for illustrating the y-component and the z-component of the magnetic flux density B under the same conditions as in FIG. 2 and likewise assuming a homogeneous current density distribution over the cell cross section.

By way of example, FIGS. 2 and 3 show the distribution of the magnetic flux density around a stack with a square cross section in this exemplary embodiment, through which a current with a homogenous current density distribution flows. In this example, the left side of FIGS. 2 and 3 shows the end face of the stack with the sensors arranged on a circular arc around the stack, wherein the measurement locations at which the sensors are positioned are indicted as "x" on the circular arc. The end face of the stack is divided into area squares one of which is designated as $SC_{11}$. FIG. 2 shows the absolute magnitude of the magnetic flux density and FIG. 3 shows the y-component and z-component of the magnetic flux density, which are respectively designated as y-comp.(homo CCD) and z-comp. (homo CCD) for the case of homogeneous cell current densities. In an ideally operating stack, the magnetic field component in the x-direction is Bx=0. Boundary effects at end faces and inhomogeneities in the cell structure and the stack structure as well as the gas supply for the anode and cathode result in a non-homogenous current density distribution, however. Such a distribution leads to current density components in the y-direction and in the z-direction in the stack, and hence to a magnetic field component Bx in the x-direction.

The following measurements are possible, among others, using the measurement method according to the invention:

1) Detection of points (cells) with a high Jy-component and Jz-component. These are points at which the current density distribution Jx(x, y, z) changes. The total current, which remains constant, is in this case the integral over Jx(x, y, z). At points where the Jy-component and, respectively, the Jz-component are high, there is a magnetic field component Bx(x) that is not equal to zero. In a first step, the magnetic sensor is moved along the x-axis (see coordinate system in FIG. 1), and the magnetic field component Bx is measured. A Bx component of the external magnetic field is then an indication of the current density components Jy and Jz in the y-direction and the z-direction, that is to say an indication that the current density distribution Jx(x, y, z) changes. The gradient of the flux density Bx in the x-direction is a measure of the intensity of the change in Jx(x, y, z).

2) Detection of the current density distribution Jx(x0, y, z) across the cell cross section A at the point x=x0. For this purpose, the magnetic field components By and Bz at the point x=x0 are measured at a number of points on a circumference, in the plane x=x0. The number of measurement points N depends on the current density resolution required, and is at least:

N=0.5 times the number of area squares into which the stack cross section (which corresponds to the cell cross section) is subdivided when the flux density By and Bz is measured.

If only one component of the flux density is measured (By or Bz), the number of measurement points N is equal to the number of area squares into which the stack cross section (which corresponds to the cell cross section) is subdivided. However, the number of measurement values N may also be greater than the minimum number. It is then possible to use these measurement values of the magnetic flux density (By, Bz) together with the position at which they were measured (x=x0, y, z) to deduce the current density distribution at the point x=x0 in the interior of the stack. To do this, the equations (1) and (2) must be solved in discrete form for the current density J. A matrix inversion according to equation (4) is thus required.

One measurement example will be explained in more detail below. Detection of the current density in the plane x=x0 on the assumption that 100 area squares are to be resolved means that 100 unknown current densities are to be calculated. In this case, each area square has its own current density. A linear equation system with 100 equations is required. In order to produce this equation system, 50 flux densities must be recorded in the plane x=x0, including their position relative to the stack. These 50 measurement points contain 50 flux density pairs (By, Bz), which are then used to produce the equation system for the current density J(x0, y, z). The solution of this linear equation system then leads to the current density distribution J(x0, y, z).

Figure 5:
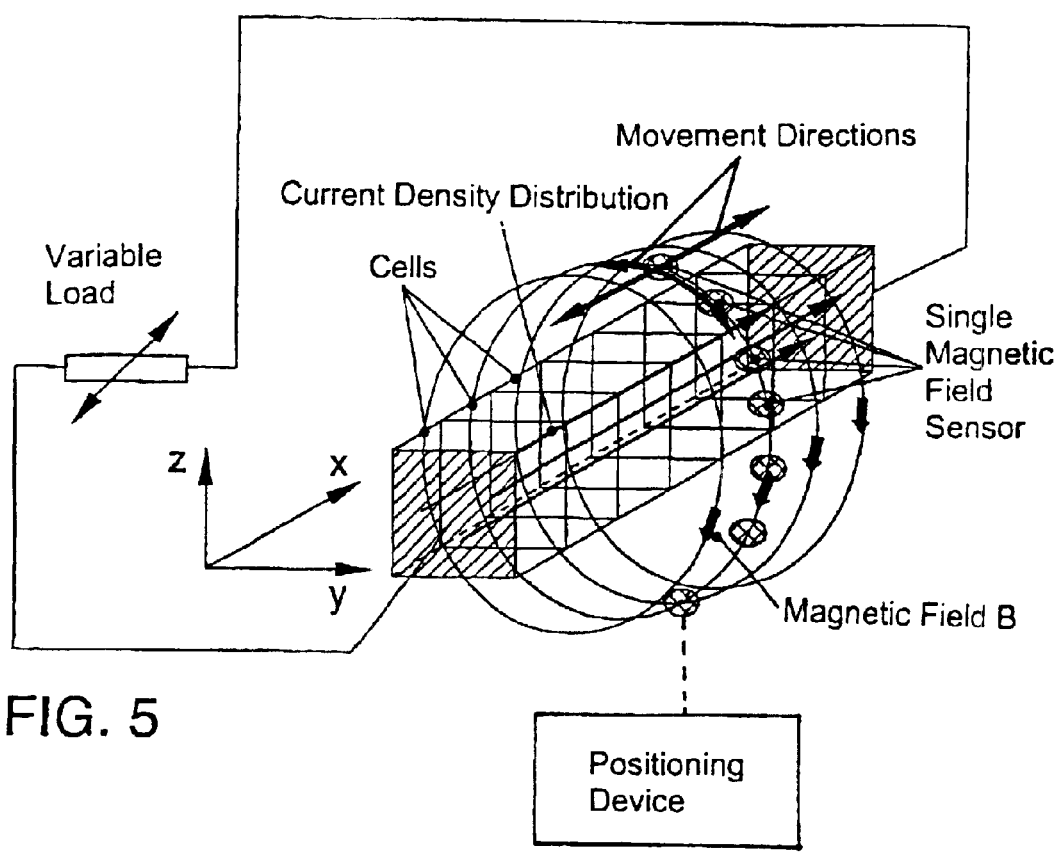
FIG. 5 is a schematic view of a configuration of a measurement apparatus according to the invention with a single magnetic field sensor in various measurement positions.

In this case, it is particularly advantageous if, as is shown in FIG. 5, the measurement points are recorded sequentially. A single sensor for the flux density and a further sensor for the position of the flux density sensor are successively moved to the various measurement points and the measurements are carried out successively in time with the single sensor for the flux density and the further sensor for the position of the flux density sensor.

Figure 4:
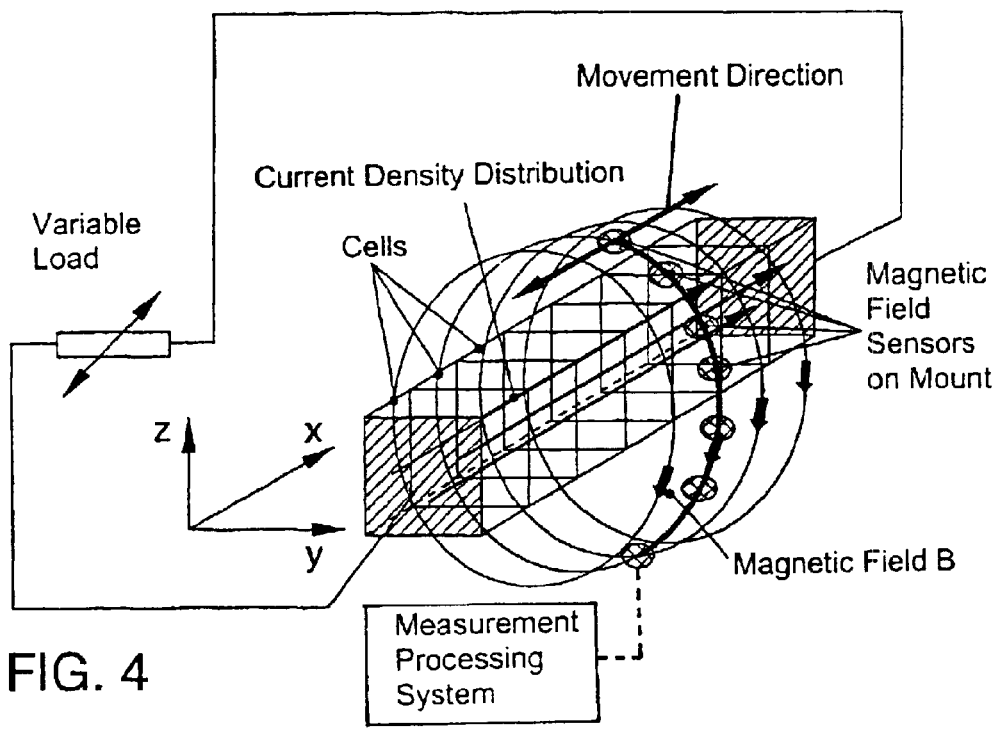
FIG. 4 is a schematic view of a configuration of a measurement apparatus according to the invention with a number of sensors on a common mount.

In a further advantageous variant which is illustrated in FIG. 4, the measurement points are recorded in parallel, with a number of sensors being provided for the flux density and the position, and all the measurement values being detected at the same time.

The measurement points may in this case be recorded in parallel by using a number of sensors and may in addition be recorded sequentially, with a number of measurement values being detected in parallel and the sensors then being repositioned, and a further set of measurement values being detected.

Alternatively, a position sensor may be replaced by a mechanism, with an apparatus being provided for an origin identification, which apparatus is combined with an algorithm for counting steps in a positioning device with fixed increments (stepping motor), with the position in this case preferably being indicated relative to a reference point (origin). A positioning device, such as a stepping motor, which may be used to move a sensor to the measurement points is only schematically indicated in FIG. 5.

In a parallel measurement with a number of sensors, these sensors are advantageously arranged such that they are spatially fixed relative to one another, preferably on a common mount, and may then be positioned, preferably jointly, in the main direction x of the fuel cell stack (FIG. 4). The common mount for the sensors is only schematically indicated as a bold line along which the sensors in FIG. 4 are positioned.

The distance between the flux density sensors and the stack can be varied in order in this way to make it possible to match the measurement range of the sensors to the flux density outside the stack.

The sensors in the measurement configuration may all be arranged in one plane, preferably in a plane defined by x=x0.

The component Bx of the magnetic field is preferably evaluated in order to identify points at which the current density distribution changes.

Alternatively, sensors may be used which measure all three flux density components Bx, By, Bz.

However, the sensors which are used may also each detect only one component Bx, By or Bz.

Separate sensors may be used for the field component Bx and for the field components By and Bz.

More measurement values may be detected than is necessary for the desired resolution of the current density.

Alternatively, iterative calculation methods may be used for the calculation of the equation systems for the current density distribution.

Alternatively or in addition, comparisons with magnetic fields of fuel cell stacks with a known current density distribution may be carried out in order to solve the equation systems for the current density values, with these results being used to deduce the current density distribution on the fuel cell stack which is to be measured.

A Monte Carlo algorithm may be used for the calculation of the current density values in order to solve the equation system, wherein current density distributions are assumed, the resultant field is calculated and is then compared with the measured field, with this assumed current density distribution then being corrected in a next iteration loop, such that the differences between the calculated field and the measurement field become smaller. The method is terminated when the correlation between the calculated field and the measured field is sufficiently high. The assumed current density distribution then represents the result.

The measurement result can be made more precise with respect to the resolution of the current density distribution by increasing the number of measurement values for the flux density and the position.

Furthermore, the earth's magnetic field can be measured in a measurement which is carried out before the actual measurement, with these values then being subtracted from the actual measurement.

Alternatively, the fuel cell current can be modulated with a low frequency, and the influence of the quasi-static earth's magnetic field on the measurement result can be suppressed through the use of appropriate hardware and/or software filters for the flux density measurements.

All the measurement values (position, magnetic field, current flow) can be supplied to an electronic measurement processing system such as a computer. The current density distribution is then automatically calculated, stored and compared with earlier measurements in the electronic measurement processing system. The electronic measurement processing system is only schematically indicated in FIG. 4 but can of course also be provided in the embodiment shown in FIG. 5.

The measurement method according to the invention also allows a measurement of the magnetic field strength H of the magnetic field B which is produced by the current flow in the stack.

Furthermore, it is possible to subdivide the measurement process into two partial measurements, wherein the entire stack is scanned with a coarse resolution in a first partial measurement process, and the critical areas are then investigated with a higher resolution in a second partial measurement process.

I claim:

1. A method for determining a current density distribution in a fuel cell stack, the method which comprises:
   providing a current flow through the fuel cell stack such that the current flow generates a magnetic field surrounding the fuel cell stack; and
   determining the current density distribution in the fuel cell stack from the magnetic field surrounding the fuel cell stack.

2. The method according to claim 1, which comprises:
   positioning at least one sensor at given positions outside the fuel cell stack for detecting an x-component of a magnetic flux density, a y-component of a magnetic flux density, and a z-component of a magnetic flux density, with x, y, and z indicating axes in a Cartesian coordinate system;
   determining the given positions of the at least one sensor with respect to the fuel cell stack;
   calculating current density values as a function of respective positions in the fuel cell stack from values of the magnetic flux density and the given positions associated therewith; and
   performing the calculating step by using a Maxwell's equation defining a magnetic field strength, and by using a material equation defining a relationship between the magnetic field strength and the magnetic flux density.

3. The method according to claim 2, which comprises sequentially recording measurement points by moving a single flux density sensor to the measurement points in order to sequentially measure a magnetic flux density at the measurement points and by moving a further sensor to the measurement points in order to determine a position of the single flux density sensor.

4. The method according to claim 2, which comprises recording measurement points in parallel by using a plurality of sensors for measuring a magnetic flux density and for determining respective positions such that all measurement values are recorded simultaneously.

5. The method according to claim 2, which comprises recording measurement points with a plurality of sensors in parallel and additionally recording measurement points sequentially by recording a set of measurement values in parallel and by subsequently repositioning the plurality of sensors and recording a further set of measurement values.

6. The method according to claim 2, which comprises identifying a reference point and using an algorithm for counting steps in a positioning device operating with fixed increments for positioning the at least one sensor.

7. The method according to claim 6, which comprises indicating a position of the at least one sensor relative to the reference point.

8. The method according to claim 2, which comprises:
   positioning a plurality of sensors spatially fixed with respect to one another; and
   performing a parallel measurement with the plurality of sensors.

9. The method according to claim 8, which comprises:
   providing the plurality of sensors on a common mount such that the plurality of sensors are spatially fixed with respect to one another; and
   moving the plurality of sensors jointly along an x-direction defining a main direction of the fuel cell stack.

10. The method according to claim 2, which comprises varying a distance between the at least one sensor for detecting a magnetic flux density and the fuel cell stack in order to match a measurement range of the at least one sensor to a magnetic flux density outside the fuel cell stack.

11. The method according to claim 2, which comprises positioning a plurality of sensors for detecting a magnetic flux density in a given plane.

12. The method according to claim 2, which comprises positioning a plurality of sensors for detecting a magnetic flux density in a given plane such that an x-axis defines a main axis of the fuel cell stack and such that the x-axis is orthogonal with respect to the given plane and such that the given plane and the x-axis define an intersection point.

13. The method according to claim 2, which comprises evaluating the x-component of the magnetic flux density in order to identify points at which the current density distribution in the fuel cell stack changes, wherein the x-component of the magnetic flux density is directed along a main direction of the fuel cell stack.

14. The method according to claim 2, which comprises using sensors each configured to measure three magnetic flux density components including the x-component of a magnetic flux density, the y-component of a magnetic flux density, and the z-component of a magnetic flux density.

15. The method according to claim 2, which comprises using sensors each configured to measure only one magnetic flux density component selected from the group consisting of the x-component of a magnetic flux density, the y-component of a magnetic flux density, and the z-component of a magnetic flux density.

16. The method according to claim 2, which comprises:
   using at least a first sensor for detecting the x-component of a magnetic flux density; and
   using at least a second sensor for detecting the y-component and the z-component of a magnetic flux density.

17. The method according to claim 2, which comprises acquiring more measurement values than necessary for a desired resolution of the current density distribution in the fuel cell stack.

18. The method according to claim 2, which comprises:
   providing an equation system for the current density distribution in the fuel cell stack; and
   using an iterative calculation method for calculating the equation system for the current density distribution.

19. The method according to claim 2, which comprises deducing the current density distribution in the fuel cell stack by comparing measurement values of the magnetic field surrounding the fuel cell stack with magnetic fields of fuel cell stacks having known current density distributions.

20. The method according to claim 2, which comprises:
providing an equation system for the current density distribution in the fuel cell stack;
using an iterative calculation method for calculating the equation system for the current density distribution; and
additionally deducing the current density distribution in the fuel cell stack by comparing measurement values of the magnetic field surrounding the fuel cell stack with magnetic fields of fuel cell stacks having known current density distributions.

21. The method according to claim 2, which comprises:
providing an equation system for the current density distribution in the fuel cell stack;
using a Monte Carlo algorithm for calculating current density values in order to solve the equation system by performing the following steps:
using an assumed current density distribution for providing a calculated magnetic field resulting from the assumed current density distribution;
comparing the calculated magnetic field with a measured magnetic field;
correcting the assumed current density distribution in a subsequent iteration loop, such that a difference between the calculated magnetic field and the measured magnetic field is reduced; and
terminating the Monte Carlo algorithm when a correlation between the calculated magnetic field and the measured magnetic field reaches a given correlation strength, and using the assumed current density distribution as a result.

22. The method according to claim 2, which comprises increasing a resolution of the current density distribution calculated from measurement results by increasing a number of measurement values for the magnetic flux density and the given positions of the at least one sensor.

23. The method according to claim 2, which comprises:
measuring an earth's magnetic field prior to detecting a magnetic flux density outside the fuel cell stack; and
subtracting the earth's magnetic field from the magnetic flux density detected outside the fuel cell stack.

24. The method according to claim 2, which comprises:
modulating the current flow through the fuel cell stack with a given frequency; and
suppressing an influence of a quasi-static earth's magnetic field on a measurement result by using at least one filter selected from the group consisting of a hardware filter and a software filter for flux density measurements.

25. The method according to claim 2, which comprises:
supplying all measurement values of the magnetic field surrounding the fuel cell stack to an electronic measurement processing system;
automatically calculating and storing the current density distribution in the fuel cell stack; and
comparing the current density distribution with previous measurement results.

26. The method according to claim 2, which comprises:
supplying all measurement values of the magnetic field surrounding the fuel cell stack, of the given positions of the at least one sensor and of the current flow through the fuel cell stack to an electronic measurement processing system;
automatically calculating and storing the current density distribution in the fuel cell stack; and
comparing the current density distribution with previous measurement results.

27. The method according to claim 2, which comprises measuring a magnetic field strength of the magnetic field generated by the current flow through the fuel cell stack.

28. The method according to claim 2, which comprises:
performing a first measurement by scanning the fuel cell stack entirely with a first resolution; and
performing a second measurement by scanning critical areas of the fuel call with a second resolution, such that the second resolution is finer than the first resolution.

* * * * *